United States Patent
Chen

[11] Patent Number: 6,147,384
[45] Date of Patent: Nov. 14, 2000

[54] METHOD FOR FORMING PLANAR FIELD EFFECT TRANSISTORS WITH SOURCE AND DRAIN AN INSULATOR AND DEVICE CONSTRUCTED THEREFROM

[75] Inventor: Ih-Chin Chen, Richardson, Tex.

[73] Assignee: Texas Instruments Incorporated, Dallas, Tex.

[21] Appl. No.: 09/375,994

[22] Filed: Aug. 17, 1999

Related U.S. Application Data

[62] Division of application No. 08/992,874, Dec. 17, 1997.
[60] Provisional application No. 60/033,504, Dec. 19, 1996.

[51] Int. Cl.$^7$ ............................. H01L 27/01; H01L 29/76
[52] U.S. Cl. ......................... 257/347; 257/353; 257/354; 257/385; 257/386; 257/66
[58] Field of Search .................................... 257/347, 353, 257/385, 386, 66, 354; 438/226, 297, 294

[56] References Cited

U.S. PATENT DOCUMENTS

| | | | |
|---|---|---|---|
| 4,041,518 | 8/1977 | Shimizu et al. | 257/385 |
| 4,251,828 | 2/1981 | Sakurai | 257/386 |
| 4,487,639 | 12/1984 | Lam et al. | 438/297 |
| 4,654,958 | 4/1987 | Baerg et al. | 438/226 |
| 5,213,991 | 5/1993 | Inokawa et al. | 438/294 |
| 5,712,495 | 1/1998 | Suzawa | 257/51 |

OTHER PUBLICATIONS

IEDM 1985, "A Novel MOS Device Structure with S/D Contacts Over Oxide (COO)", pp. 204–207 (C.H. Dennison, et al.).
1996 Symposium on VLSI Technology Digest of Technical Papers, "O.15 μm Delta–Doped CMOS With On–Field Source/Drain Contacts", pp. 172–173 (K. Imai, et al.).

*Primary Examiner*—Steven H. Loke
*Assistant Examiner*—Shouxiang Hu
*Attorney, Agent, or Firm*—Jacqueline J. Garner; Wade James Brady, III; Frederick J. Telecky, Jr.

[57] ABSTRACT

A method of forming a field effect transistor with source and drain on an insulator includes forming a first void region (11) in the outer surface of a semiconductor body (10) and forming a second void region (11) in the outer surface of a semiconductor body. The first void region is separated from the second void region by a portion of the semiconductor body (10). The method further includes depositing a dielectric material in the first void region to form a first insulating region (16) and depositing a dielectric material in the second void region to form a second insulating region (16). The method further includes planarizing the first and second insulating regions to define a planar surface (17). The method also includes forming a conductive source region (34) overlying the first insulating region, forming a conductive drain region (36) overlying the second insulating region, and forming a conductive gate body (24) overlying the planar surface and spaced apart from the conductive source region and the conductive drain region.

A field effect transistor device (50) having a substrate (10) is provided. The transistor (50) includes a conductive gate body (24) and a gate insulator layer (32) having a planar outer surface adjacent to the conductive gate body and a planar inner surface (39). The transistor further includes first and second insulating regions (16) formed on the substrate. The transistor (50) also includes a conductive drain region (36) formed on the second insulating region and a conductive source region (34) formed on the first insulating region and spaced apart from the conductive gate body (24) opposite the conductive drain region (36). The conductive drain region and conductive source region define a portion of the planar inner surface (39).

18 Claims, 4 Drawing Sheets

METHOD FOR FORMING PLANAR FIELD EFFECT TRANSISTORS WITH SOURCE AND DRAIN AN INSULATOR AND DEVICE CONSTRUCTED THEREFROM

RELATED APPLICATIONS

This application is related to co-pending application Ser. No. 08/989,985, filed Dec. 12, 1997, now U.S. Pat. No. 5,913,135 entitled *Method for Forming Planar Field Effect Transistors with Source and Drain on Oxide and Device Constructed Therefrom*, both applications having the same assignee. This application is a divisional application of Application Ser. No. 08/992,874, filed on Dec. 17, 1997 and Provisional Application No. 60/033,504, filed on Dec. 19, 1996.

TECHNICAL FIELD OF THE INVENTION

This invention relates in general to the field of electronic devices and more particularly to a method for forming planar field effect transistors with source and drain on an insulator and device constructed therefrom.

BACKGROUND OF THE INVENTION

A field effect transistor comprises doped source and drain regions. These doped source and drain regions conventionally are formed on a substrate of a semiconductor material. A parasitic source/drain junction capacitance develops in such devices due to the junctions of the source and drain with the substrate. Junction capacitances may be undesirable because, since they must be charged before current can flow, they may slow down the field effect transistor.

In order to reduce the junction capacitance in field effect transistors occurring due to the junctions of the source and drain with the substrate, previous efforts have attempted to place an oxide region between the source and substrate and another oxide region between the drain and substrate. In one of these efforts a field effect transistor is fabricated with a channel length approximately the same as the gate length. The use of such a technique results in a non-planar gate oxide near the channel due to the inclusion of the additional oxide regions. Non-planar gate oxide may be disadvantageous. For example, devices formed with non-planar gate oxide may suffer gate oxide integrity problems.

In another approach, a field effect transistor is fabricated with a source and drain on oxide regions with a minimum distance between oxide regions greater or significantly greater than the length of the gate. In such a technique, the oxide regions may not completely isolate the source and drain regions from the substrate. Therefore, the junction capacitance associated with these devices is only marginally better than bulk CMOS devices. Additionally, the oxide regions do not restrict the source and drain depths. Thus, short channel effects are similar to those associated with bulk CMOS devices.

SUMMARY OF THE INVENTION

Accordingly, a need has arisen for a field effect transistor with source and drain on an insulator that reduces junction capacitance. In accordance with the teachings of the present invention, a method of forming a field effect transistor with source and drain on an insulator and apparatus formed therefrom is provided that addresses disadvantages associated with prior systems and processing methods.

According to one aspect of the invention a method of forming a transistor includes forming a first void region in the outer surface of a semiconductor body and forming a second void region in the outer surface of a semiconductor body. The first void region is separated from the second void region by a portion of the semiconductor body. The method further includes depositing a dielectric material in the first void region to form a first insulating region and depositing a dielectric material in the second void region to form a second insulating region. The method further includes planarizing the first and second insulating regions to define a planar surface. The method also includes forming a conductive source region overlying the first insulating region, forming a conductive drain region overlying the second insulating region, and forming a conductive gate body overlying the planar surface and spaced apart from the conductive source region and the conductive drain region.

According to another embodiment of the invention, a field effect transistor device having a substrate is provided. The transistor includes a conductive gate body and a gate insulator layer having a planar outer surface adjacent to the conductive gate body and a planar inner surface. The transistor further includes first and second insulating regions formed on the substrate. The transistor also includes a conductive drain region formed on the second insulating region and a conductive source region formed on the first insulating region and spaced apart from the conductive gate body opposite the conductive drain region. The conductive drain region and conductive source region define a portion of the planar inner surface.

The invention provides several technical advantages. For example, the invention provides a field effect transistor that reduces the junction capacitance associated with source-substrate junctions and drain-substrate junctions. Thus, devices incorporating such field effect transistors may operate more quickly. In addition, the formation of insulating regions between the source and substrate and between the drain and substrate limits the depths of the source and drain and therefore helps prevent short channel effects. Furthermore, unlike conventional field effect transistors, the capacitance of field effect transistors according the present invention may be tailored based on design parameters by varying the thickness of insulating regions underlying the source and drain, rather than dictated by design constraints.

BRIEF DESCRIPTION OF THE DRAWINGS

A more complete understanding of the present invention may be acquired by referring to the accompanying drawings in which like reference numbers indicate like features and wherein.

DETAILED DESCRIPTION OF THE INVENTION

Figure 1A:
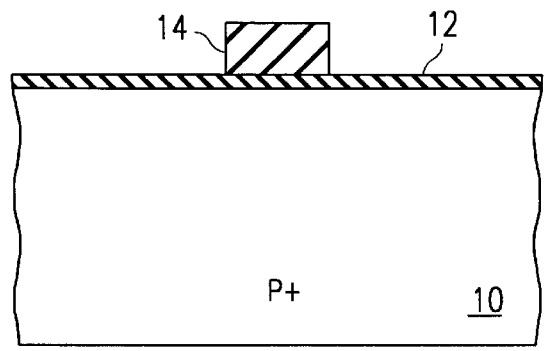
FIG. 1a through 1j are a series of schematic cross-sectional diagrams illustrating one embodiment of a field effect transistor constructed according to the teachings of the present invention and the method of the invention for constructing the same.

FIGS. 1a through 1j illustrate the sequential processing steps that may be used to construct a planar surface on which a field effect transistor may be constructed with source and drain on an insulator. Referring to FIG. 1a, a substrate 10 is doped with sufficient p-type ions such as boron to form a p$^+$ substrate. The embodiment of the invention illustrated in FIGS. 1a though 1j is described as formed on a p+ substrate. However it should be understood that a transistor may be formed according to the invention on a substrate doped with n-type ions to form an n+ substrate. On the outer surface of substrate 10, a thin pad oxide layer 12 is deposited. Pad oxide layer 12 may alternatively be replaced with a layer of suitable material that can insulate substrate 10 from a subsequently formed nitride mask region 14. Pad oxide layer 12 may be approximately 100–200 A thick; however, other suitable thickness for pad oxide layer may be used. On the outer surface of pad oxide layer 12, a nitride layer or layer of other masking material is deposited, patterned, and etched using conventional photolithographic techniques, to form nitride mask region 14. Nitride mask region 14 provides a mask over portions of substrate 10 to prevent the unwanted growth of oxide on substrate 10.

Figure 1B:
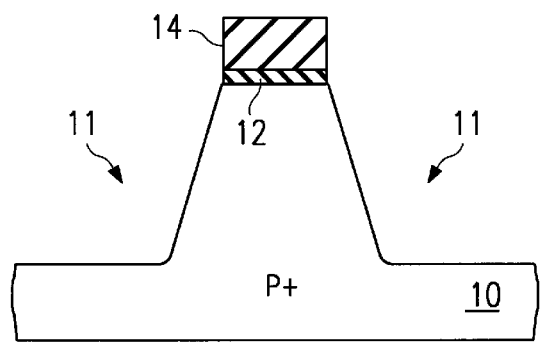

Referring to FIG. 1b, regions of pad oxide 12 and substrate 10 are etched with a shallow trench etch to form void regions 11. Void regions 11 will later be filled with an appropriate dielectric material, such as oxide or nitride.

Figure 1C:
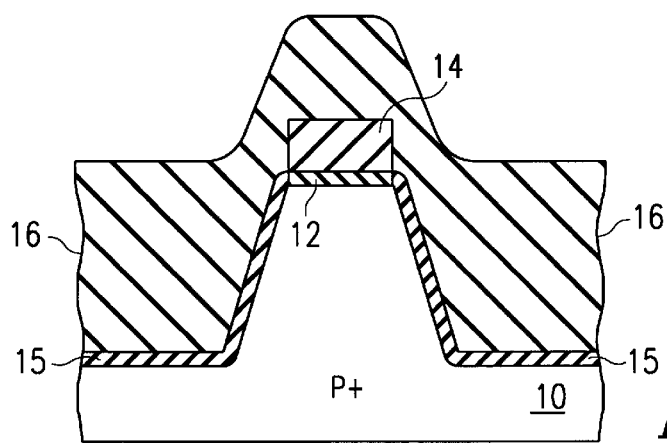

FIG. 1c illustrates an intermediate structure during the formation of a field effect transistor after several additional processing steps. A layer 15 of oxide is thermally grown overlying substrate 10. In one embodiment, layer 15 is grown to a thickness of approximately 100–400 A; however, other suitable thicknesses may be used. Overlying layer 15 and nitride region 14, a dielectric is deposited to fill void regions 11 and form insulating regions 16. Insulating regions 16 may be formed, for example, by depositing a dielectric material, such as oxide, using a low pressure or plasma chemical vapor deposition (CVD) technique. Layer 15 provides a surface on which a dielectric may be deposited in order to form insulating regions 16. One purpose for layer 15 is to isolate substrate 10 from the deposited material in insulating region 16. Insulating regions 16 provide an insulating region between substrate 10 and subsequently formed source and drain regions of a field effect transistor. Insulating regions 16 may be formed having a thickness of approximately 0.5–0.9 µm; however, other suitable thicknesses may be used. Insulating regions 16 may be formed from a variety of dielectric materials, including oxide.

Figure 1D:
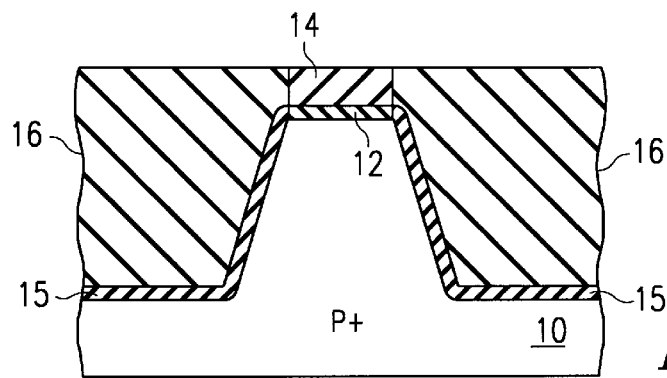
Figure 1E:
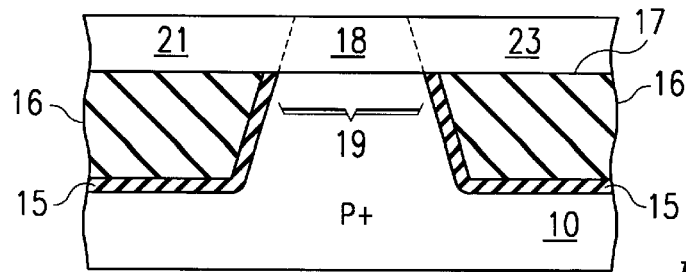

Referring to FIG. 1d, a planarization step is applied to insulating regions 16 and nitride region 14, resulting in a planar surface defined by insulating regions 16 and nitride region 14. Planarization may comprise a chemical mechanical polish (CMP); however, other planarization techniques may be used that can provide a planar outer surface such as an etch back process using a plasma source. After planarization, nitride region 14 is stripped, and pad oxide layer 12 and portions of insulating regions 16 are removed through an oxide deglaze to provide planar outer surface 17. Alternatively, the planarization process may planarize to a depth such that nitride region 14 and pad oxide region 12 are removed, resulting in planar outer surface 17. Planar outer surface 17 provides a planar surface on which a field effect transistor may be formed having source and drain on oxide. The planarization step may be tailored to leave only desired portions of insulating regions 16 on which a source and drain may be formed and to provide a desired minimum distance 19 between the two insulating regions 16 (FIG. 1e). In one embodiment, the minimum distance 19 between insulating regions 16 is approximately 0.1–0.2 µm; however, other channel lengths suitable for use with field effect transistors may be used. Planar outer surface 17 allows for the formation of gate oxide on a planar surface, which may eliminate the problems associated with non-planar gate oxide.

Moreover, planar outer surface 17 provides a surface on which a field-effect transistor may be formed having a gate length approximately the same as minimum distance 19 between insulating regions 16. Therefore, the source and drain may be effectively isolated from the substrate and junction capacitances may be reduced to a greater extent than reductions in junction capacitances associated with source/drain on oxide devices having a minimum distance between oxide regions larger or significantly larger than the gate length.

According to the steps described below, a field effect transistor having a source and a drain on oxide may be formed on outer planar surface 17 that has a planar gate oxide and possesses lower junction capacitance, which increases the switching speed of the transistor and does not suffer the gate oxide integrity problems associated with nonplanar gate oxide. Referring to FIG. 1e, an epitaxial region 18 of p-type semiconductor material is grown on the outer surface of substrate 10 through a nonselective epitaxial growth process. At the same time, polysilicon regions 21 and 23 are grown on the outer surface of insulating regions 16, as shown in FIG. 1e. The non-selective epitaxial growth process will form epitaxial silicon over substrate 10 and polysilicon over insulating regions 16. An example thickness range for epitaxial region 18 and polysilicon regions 21 and 23 is approximately 300 A–1500 A; however, other thicknesses may be used.

The source and drain of the field effect transistor according to the invention will be formed in polysilicon regions 21 and 23, respectively. The channel of the field effect transistor according to the invention will be in epitaxial region 18. Because the channel occurs in single crystalline silicon, losses in carrier mobility attributable to the use of polycrystalline silicon for the channel may be avoided.

Figure 1F:
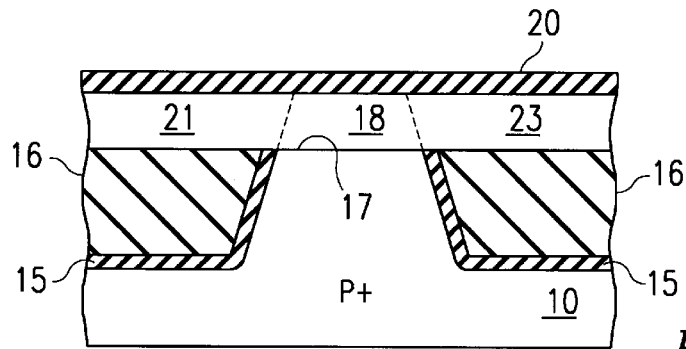
Figure 1G:
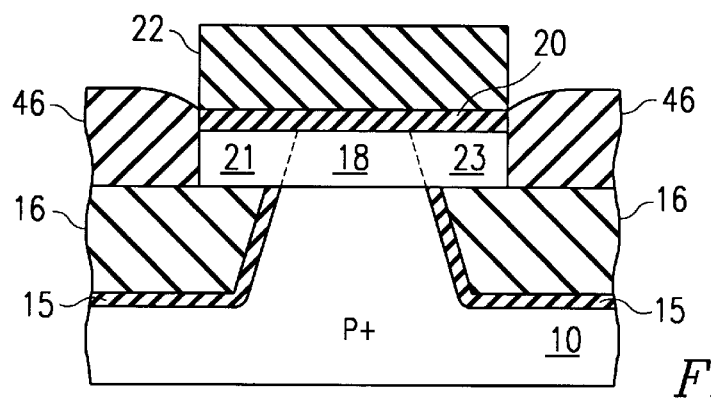
Figure 1H:
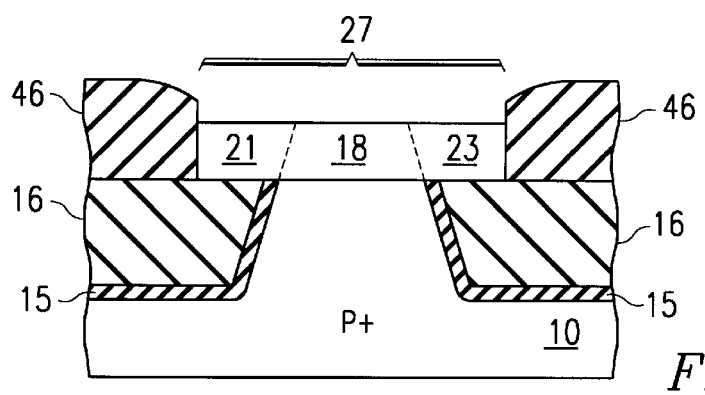

One method for defining an active region 27 for the formation of a field effect transistor according to the invention is described with reference to FIGS. 1f and 1g. Other active region definition techniques may, however, be incorporated, including the method discussed below in conjunction with FIGS. 2a through 2e. An oxide layer 20 is deposited on the outer surface of epitaxial region 18. Oxide layer 20 separates epitaxial region 18, and polysilicon regions 21 and 23 from a subsequently formed nitride mask region 22. Oxide layer 20 may be replaced with a layer of another suitable insulating material. On the outer surface of layer 20, a nitride layer is deposited, and patterned and etched using conventional photolithographic techniques, to form nitride mask region 22. Oxide layer 20 may also be etched during etching of the nitride layer. Nitride mask region 22 provides a mask over portions of epitaxial region 18 and polysilicon regions 21 and 23 to prevent the unwanted growth of oxide on epitaxial region 18 and portions of polysilicon regions 21 and 23. Field oxide regions 46 are then formed overlying insulating regions 16 through a local oxidation of silicon (LOCOS) process to isolate the resulting transistor from adjacent semiconductor devices and to define an active region 27 for the transistor, shown in FIG. 1h. Nitride region 22 and pad oxide layer 20 are then stripped, as shown in FIG. 1h. Active region 27 defines the area in which the resulting transistor will be formed.

Figure 1I:
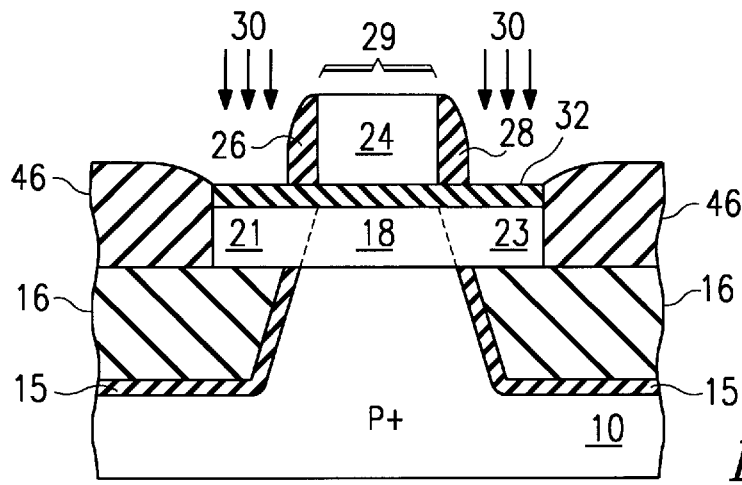
Figure 1J:
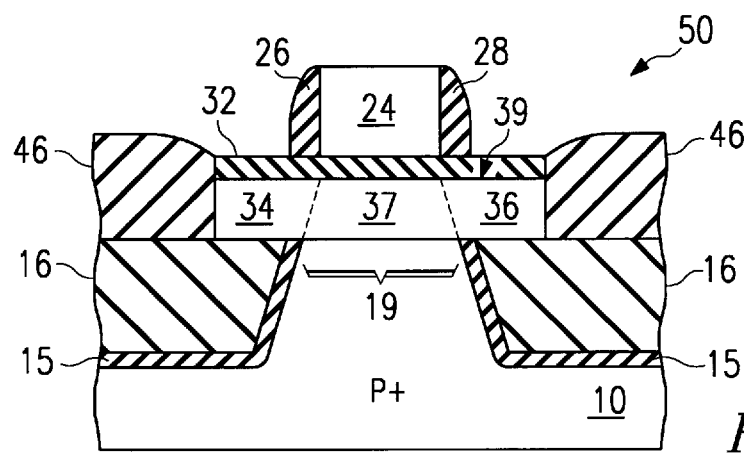

FIG. 1i illustrates several processing steps associated with forming a transistor in action region 27 and the resulting structure. Referring to FIG. 1i, a gate oxide layer 32 is grown on the outer surface of epitaxial region 18 and polysilicon regions 21 and 23. In one embodiment, gate oxide 32 may be grown to a thickness of approximately 25–100 A;

however, other thicknesses for gate oxide 32 may be used. A layer of polysilicon is then deposited, patterned and etched using conventional photolithographic techniques to form polysilicon gate body 24. In one embodiment, polysilicon gate body 24 has a gate length 29 that is approximately the same or greater than the minimum distance 19 between insulating regions 16; however, gate length 29 may be shorter than minimum distance 19 between insulating regions 16. Sidewalls 26 and 28 are then formed adjacent polysilicon gate body 24. Polysilicon gate body 24 may be formed, for example, by depositing an insulating material, such as oxide or nitride, using a low pressure or plasma chemical vapor deposition (CVD) technique. The insulating material is then anisotropically etched until a desired portion of gate oxide 32 is exposed. Ions are then implanted, self-aligned, in polysilicon regions 21 and 23 through gate oxide 32 to form source region 34 and drain region 36, as shown in FIG. 1*j*. Source region 34, drain region 36, and epitaxial region 37 define a planar outer surface 39. Subsequent processing steps may also include, for example, source, drain, and gate contact formation (not explicitly shown).

The resulting transistor 50 formed according to the invention and shown in FIG. 1*j* provides a field effect transistor having a source 34 and a drain 36 on insulating regions 16 and therefore reduces parasitic capacitances associated with source/drain junctions with a substrate. Additionally because the gate oxide 32 is formed on a planar surface, gate oxide integrity problems will be less likely to develop. Furthermore, because the resulting structure formed according to one embodiment of the invention incorporates a minimum distance 19 between insulating regions 16 that is approximately the same length as gate length 29 of gate body 24, increased source/drain junction depths associated with large distances between insulating regions are avoided, resulting in further isolation of source 34 and drain 36 from the substrate 10 and reducing any parasite capacitance associated with source/drain junctions with the substrate. Moreover, the capacitance of the resulting transistor 50 may be tailored based on design concerns by varying the thickness of insulating regions 16.

FIGS. 2*a* through 2*e* illustrate the sequential processing steps that may be used according to another embodiment of the invention to construct a field effect transistor with source and drain on oxide. According to the embodiment of the invention illustrated in FIGS. 2*a* through 2*e*, the processing steps for forming a field effect transistor with source and drain on an insulator is discussed in conjunction with FIGS. 1*a* through 1*e* may be incorporated. After the planarization step resulting in the structure illustrated in FIG. 1*e*, the transistor eventually formed may be isolated from adjacent semiconductor devices by the formation of a semiconductor mesa. Exemplary processing steps associated with such a procedure are discussed below.

Figure 2A:
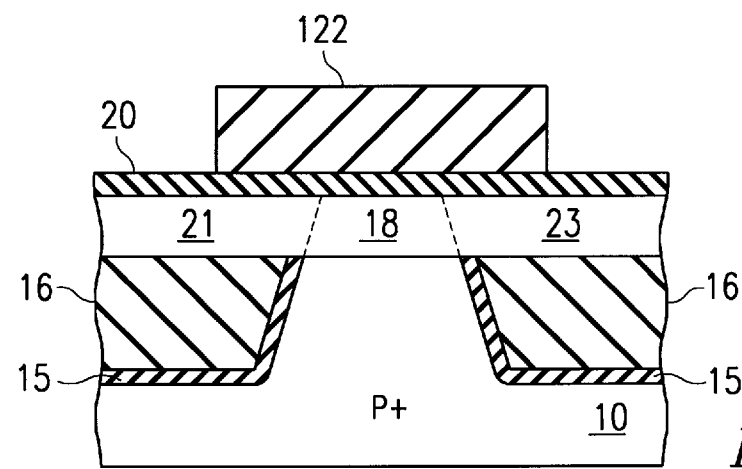
FIGS. 2a through 2e are a series of schematic cross-sectional diagrams illustrating another embodiment of a field effect transistor constructed according to the teachings of the invention and the method of the invention for constructing the same.
Figure 2B:
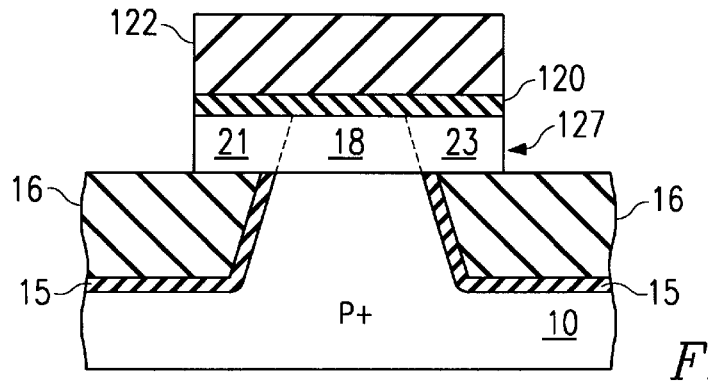
Figure 2C:
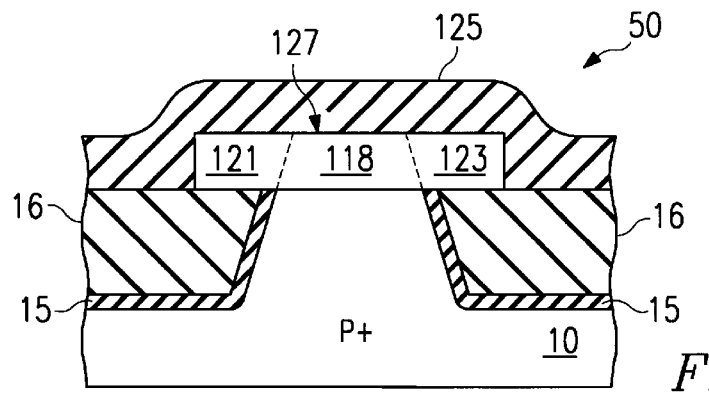

FIG. 2*a* illustrates the formation of a nitride masking layer 122. On the outer surface of layer 20, a nitride layer 122 is deposited, and patterned and etched using conventional photolithographic techniques, to form nitride mask region 122. A semiconductor mesa 121 of is then formed from polysilicon regions 21 and 23 and epitaxial region 18 through an anisotropic etch, as illustrated in FIG. 2*b*. The nitride mask region 122 acts as a mask in the formation of semiconductor mesa 121. Nitride region 122 is then stripped, as shown in FIG. 2*c*, and a layer 125 of oxide is deposited over pad oxide 120 overlying mesa 121 and insulating regions 16. Layer 125 may also be formed from nitride or other insulating materials. Layer 125 provides material that may be used to form insulating sidewalls adjacent semiconductor mesa 121.

Figure 2D:
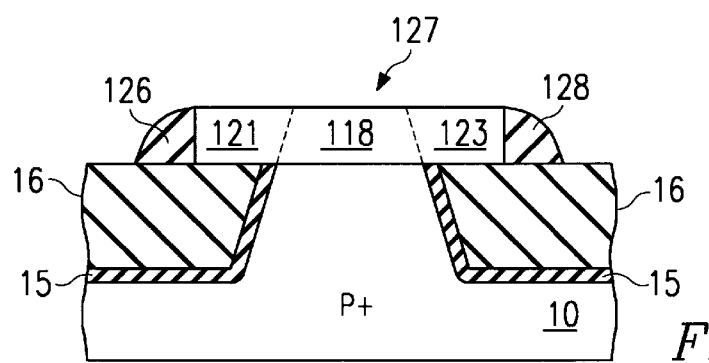
Figure 2E:
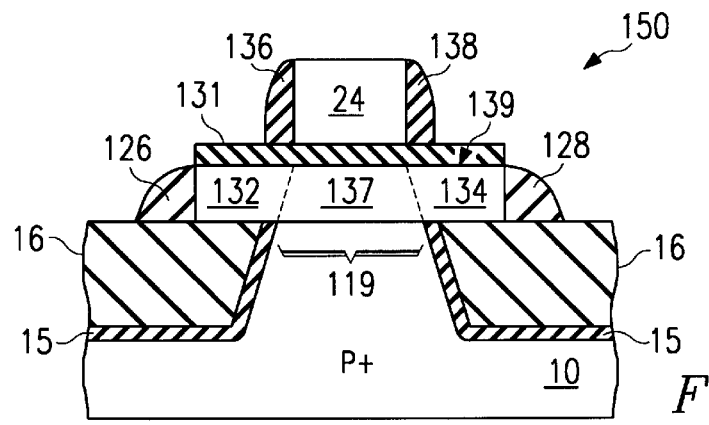

FIG. 2*d* illustrates the formation of sidewalls 126 and 128 adjacent semiconductor mesa 121. Sidewalls 126 and 128 may be formed by anisotropically etching layer 125 adjacent semiconductor mesa 121 to further isolate the resulting transistor from adjacent devices. After formation of sidewalls 126 and 128, the source, drain, and gate of a resulting transistor may be formed with source and drain regions formed within semiconductor mesa 121 on top of insulating regions 16 as illustrated in FIG. 2*e*. The steps associated with forming the source region 132, drain region 134, and gate region 124, may include, for example, growing oxide layer 131 on the outer surface of epitaxial region 118 and polysilicon regions 121 and 123; depositing, patterning and etching a layer of polysilicon using conventional photolithographic techniques to form gate body 122; forming sidewalls 136 and 138 adjacent gate body 124; and implanting polysilicon regions 121 and 123 to form source region 132 and drain region 134. Source region 134, drain region 136, and epitaxial region 137 define a planar outer surface 39. The minimum distance between insulating regions 16 is indicated in FIG. 2*e* by reference numeral 119. These steps may be performed in a similar manner to that discussed above in conjunction with FIGS. 1*g* and 1*j*. Subsequent processing steps may also include, for example, source, drain, and gate contact formation (not explicitly shown).

The resulting semiconductor device 150 shown in FIG. 2*e* provides a transistor having the same advantages discussed above in conjunction with semiconductor device 50 and therefore provides a transistor having reduced parasitic capacitance due to source/drain junctions resulting in faster switching speeds.

Although the present invention has been described in detail, it should be understood that various changes, alterations, modifications and substitutions may be made to the teachings herein without departing from the spirit and scope of the present invention which is solely defined by the appended claims.

What is claimed is:

1. A field effect transistor comprising:
    a semiconductor substrate having a pair of spaced apart void regions filled with a dielectric, said dielectric in said void regions and said substrate providing a first planar surface having a pair of spaced apart regions of said dielectric with the substrate disposed between said regions of said dielectric;
    a conductive drain region disposed solely on one of said pair spaced apart regions of said dielectric;
    a conductive source region disposed solely on the other of said pair of spaced apart regions of said dielectric;
    a region of semiconductor material disposed on said substrate between said regions of said dielectric and intimate with said source region and said drain region, wherein said source region, said drain region and said region of semiconductor material each has a second surface coplanar with the second surface of the other of said source region, said drain region and said region of semiconductor material and remote from and noncoplanar with said first planar surface;
    a gate insulator layer having a planar outer surface disposed over said second surface; and
    a conductive gate body disposed on said gate insulator.

2. The transistor of claim 1 wherein said dielectric comprise oxide deposited on the substrate.

3. The transistor of claim 2 wherein said source region and said drain region are polysilicon and said region of semiconductor material is monocrystalline silicon.

4. The transistor of claim 1 and further comprising epitaxial silicon disposed between the conductive source region and the conductive drain region.

5. The transistor of claim 4 wherein said source region and said drain region are polysilicon and said region of semiconductor material is monocrystalline silicon.

6. The transistor of claim 1 wherein said pair of spaced apart region of said dielectric are separated by a minimum distance approximately the same as the length of the conductive gate body.

7. The transistor of claim 6 wherein said source region and said drain region are polysilicon and said region of semiconductor material is monocrystalline silicon.

8. The transistor of claim 7 further including a sidewall insulator disposed between said gate insulator and said dielectric disposed in said voids disposed on sidewalls of said source region and said drain region.

9. The transistor of claim 6 further including a sidewall insulator disposed between said gate insulator and said dielectric disposed in said voids disposed on sidewalls of said source region and said drain region.

10. The transistor of claim 1 and further comprising a sidewall insulator body associated with the conductive gate body.

11. The transistor of claim 10 wherein said source region and said drain region are polysilicon and said region of semiconductor material is monocrystalline silicon.

12. The transistor of claim 1 wherein the conductive gate body comprises polysilicon.

13. The transistor of claim 12 wherein said source region and said drain region are polysilicon and said region of semiconductor material is monocrystalline silicon.

14. The transistor of claim 1 wherein the gate insulator layer comprises oxide.

15. The transistor of claim 14 wherein said source region and said drain region are polysilicon and said region of semiconductor material is monocrystalline silicon.

16. The transistor of claim 1 wherein said source region and said drain region are polysilicon and said region of semiconductor material is monocrystalline silicon.

17. The transistor of claim 16 further including a sidewall insulator disposed between said gate insulator and said dielectric disposed in said voids disposed on sidewalls of said source region and said drain region.

18. The transistor of claim 1 further including a sidewall insulator disposed between said gate insulator and said dielectric disposed in said voids disposed on sidewalls of said source region and said drain region.

* * * * *